United States Patent
Oh et al.

[19]

[11] Patent Number: 5,945,682
[45] Date of Patent: Aug. 31, 1999

[54] SPACE-SAVING ION-IMPLANTATION SYSTEM INSTALLED BOTH IN AND ADJACENT TO A SEMICONDUCTOR MANUFACTURING LINE

[75] Inventors: Sang Guen Oh; Jueng Gon Kim, both of Suwon; Tae Hyo Ro, Seoul, all of Rep. of Korea

[73] Assignee: Samsung Electronics Co., Ltd., Kyungki-do, Rep. of Korea

[21] Appl. No.: 08/929,524

[22] Filed: Sep. 15, 1997

[30] Foreign Application Priority Data

Oct. 8, 1996 [KR] Rep. of Korea ............... 96-44634

[51] Int. Cl.$^6$ ............................................. H01J 37/317
[52] U.S. Cl. ...................................... 250/492.21; 250/398
[58] Field of Search .......................... 250/299, 396 ML, 250/492.21, 398

[56] References Cited

U.S. PATENT DOCUMENTS 4,524,275  6/1985  Cottrell et al. ........................ 250/298
5,389,793  2/1995  Aitken et al. ..................... 250/492.21

OTHER PUBLICATIONS

"Flagship Products", Genus, Inc. World Wide Web Cite (www.genus.com/genus/previous_site/products/index.html).

*Primary Examiner*—Bruce C. Anderson
*Attorney, Agent, or Firm*—Jones Volentine, L.L.P.

[57] ABSTRACT

An ion-implantation system for a semiconductor device manufacturing line is designed to save space within the manufacturing line by dividing the system into a first part located adjacent to the manufacturing line and a second part located in the manufacturing line. The first part includes an ion source, an ion-extractor, an ion-exchanger, an ion mass analyzer, an ion accelerator, and a charge exchange and acceleration chamber. The second part includes a charge filter, and an end station on which a wafer is mounted for ion-implantation along an ion beam path. The outlet of the charge exchange and acceleration chamber may also be included in the second part of the system, which is located in the manufacturing line, where semiconductor device manufacturing actually takes place. The first part of the system, which may include the inlet and body of the charge exchange and acceleration chamber, may be located below the manufacturing line.

5 Claims, 1 Drawing Sheet

SPACE-SAVING ION-IMPLANTATION SYSTEM INSTALLED BOTH IN AND ADJACENT TO A SEMICONDUCTOR MANUFACTURING LINE

BACKGROUND OF THE INVENTION

1. Field of the Invention

The present invention relates to an ion-implantation system for fabricating a semiconductor device and, more particularly, to an ion-implantation system for fabricating a semiconductor device, whose respective components are rearranged in a manner so as to save space, by being installed partially in and partially adjacent to a semiconductor manufacturing line.

2. Background of the Related Art

In general, an ion-implantation system in a semiconductor device manufacturing line is capable of regulating the concentration of an impurity in the range of 10E14~10E18 atoms/cm$^3$, which is superior to prior methods such as diffusion for regulating that concentration. The ion-implantation system is widely used due to its ability to inject the impurity to a precise depth, particularly as the level of integration of semiconductor devices increases.

In general, the above described ion-implantation system comprises an ion source, an ion extractor, an ion exchanger, an ion mass analyzer, an ion accelerator, an ion converging means and an end station including the assembly of a Faraday cup and a disk on which a wafer is placed.

A high voltage of various levels is applied to the respective components for the purpose of ion-decomposition, extraction and acceleration. The high voltage changes the gas generated from the ion source into plasma and the electric field formed from this applied voltage induces the extraction of positive ions. Then, only desired ions out of the extracted ions are refracted and accelerated so as to be injected into the wafer to an appropriate depth.

FIG. 1 is a schematic view of a conventional ion-implantation system, including: a semiconductor wafer 10; the impurity source (not shown) containing the impurity to be injected by providing the impurity in gas or solid form to an ion source 12; and the ion source 12 having a power source and a vacuum pump therein generating a plasma of the supplied impurity and ionizing the plasma.

Positive ions are generated from the ion source 12 through an ion outlet 13 by applying an appropriate voltage to the ion source 12. The extracted positive ions are changed into negative ions in an ion exchanger 14 using magnesium.

The changed negative impurity ions go into an accelerator 18 via an ion mass analyzer 16, which is based on the different diameters of refraction with respect to different weights of the ions in the electric field. Because the accelerator 18 has a voltage source therein, the negative impurity ions obtain high energy before entering a charge exchange and acceleration chamber 20. The ion beam 26, which passed a charge filter 21, undergoes ion-converging, projecting and charge-classification processes, and the ion beam is then injected into a designated site on the wafer 10 placed on the disk 22. To measure a dose of the impurity, the disk 22 has a Faraday cup assembly 24, to which a backward voltage is applied so as to prevent the generation of secondary electrons due to ion-implantation, and a measuring instrument 28 to measure the dose of the impurity based on the current of the ion beam.

In the conventional ion-implantation system of FIG. 1, the ion mass analyzer 16 is located such that the ion beam is horizontally refracted, and the components from the ion source 12 through to the disk 22 having the wafer 10 thereon are all arranged in the same area of the semiconductor device manufacturing line and along the same horizontal plane.

The conventional ion-implantation system therefore takes up too much space in the semiconductor device manufacturing line, in which space-saving has become a priority for cost-reduction and product-performance reasons.

SUMMARY OF THE INVENTION

Accordingly, the present invention provides an ion-implantation system for fabricating a semiconductor device, which is designed to take up less space in the semiconductor device manufacturing line.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the ion-implantation system for a semiconductor device manufacturing line comprises: a first part located adjacent to an area containing the manufacturing line; and a second part located in the area containing said manufacturing line. The first part further comprises: an ion source, an ion-extractor, an ion-exchanger, an ion mass analyzer, an ion accelerator, and a charge exchange and acceleration chamber. The second part further comprises: a charge filter, and an end station on which a wafer is mounted for ion-implantation along an ion beam path.

The first part of the system is preferably located below the area containing the manufacturing line, and the second part of the system is arranged in the area containing the manufacturing line. Preferably, the outlet of the charge exchange and acceleration chamber is located within the second part, where actual semiconductor fabrication takes place, while the inlet and body of the charge exchange and acceleration chamber are located in the first part, below the manufacturing line. The present invention does not limit the charge exchange and acceleration chamber to be completely within the first or second part of the system, but preferably the charge exchange and acceleration chamber is partly located in the second part of the system where the semiconductor device fabrication is carried out.

In this system, the mass analyzer is arranged so as to accommodate a vertical refraction method by which the ion beam is vertically refracted in order to form a desirable ion beam path.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings illustrate an embodiment of the invention, in which:

FIG. 1 is a schematic diagram of a conventional ion-implantation system for fabricating a semiconductor device; and FIG. 2 is a schematic diagram of the ion-implantation system for fabricating a semiconductor device according to the preferred embodiment of the present invention.

DETAILED DESCRIPTION OF PREFERRED EMBODIMENT

Reference will now be made in detail to the preferred embodiment of the present invention, an example of which is illustrated in the accompanying drawings.

Figure 1:
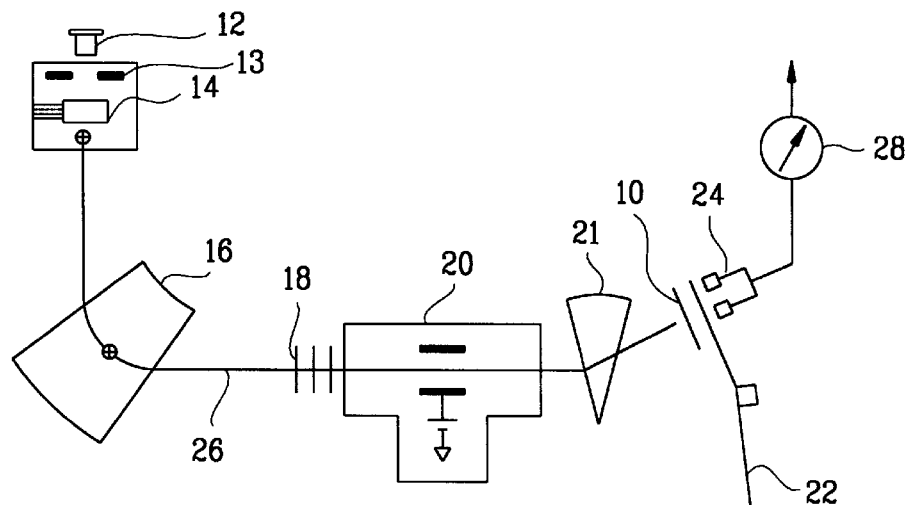
Figure 2:
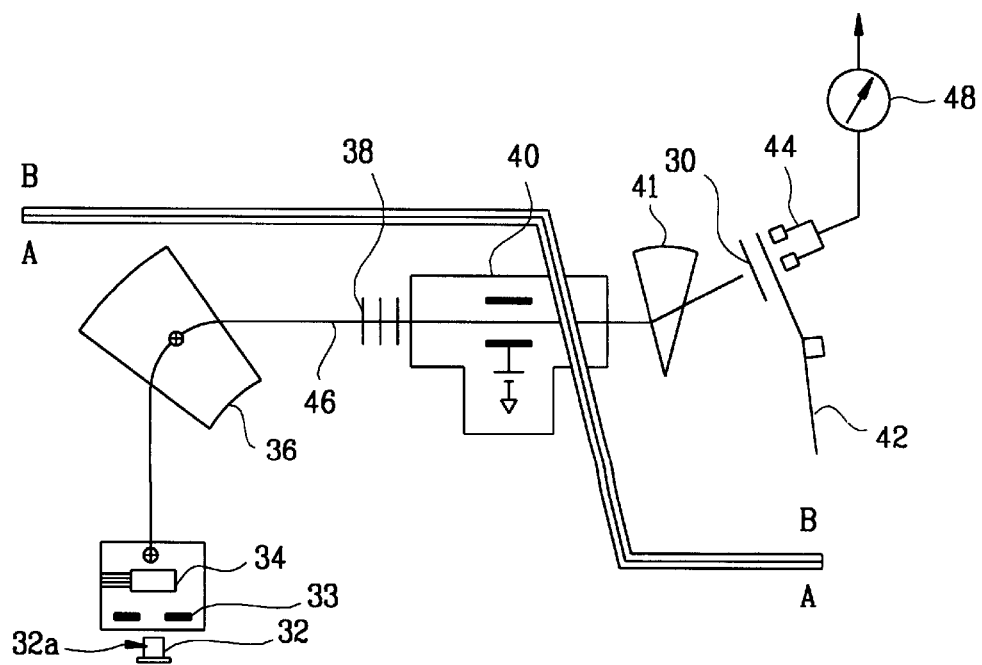

Referring to FIG. 2, which is a schematic diagram of the ion-implantation system according to the preferred embodiment of the present invention, the system is designed to have a dual structure: a first part A, located for example below the area containing the manufacturing line; and a second part B, located in the area containing the manufacturing line where actual semiconductor fabrication is carried out.

In the first part A, there are sequentially arranged an ion source 32 to which an impurity in gas or solid form is supplied from an impurity source (not shown), an ion outlet 33 for extracting positive ions generated from the ion source 32 by applying an appropriate voltage to an ion extractor, an ion exchanger 34 for changing the extracted positive ions to negative ions, an ion mass analyzer 36 for separating desired ions on the basis of different radii of curvature according to different ion weights by passing the negative impurity ions through the magnetic field formed by a magnet, a tube-shaped ion accelerator 38 having a voltage source therein for accelerating the negative impurity ions so as to give high energy to the ions, and a charge exchange and acceleration chamber 40 (manufactured by GENUS) as a charge-exchanging cell which is filled with charge-exchanging material so as to change the charge state of the impurity ion beam 46.

Additionally, the ion mass analyzer 36 is located to accommodate use of a vertical refraction method by which the ion beam 46 is vertically refracted from first part A to second part B using an angle refracting means provided therein. An impurity inlet 32a is provided on the side of the ion source 32 for supplying the impurity to be injected so as not to interfere with the extraction of the ion beam.

In the second part B, located in the area containing the manufacturing line where semiconductor device manufacturing actually takes place, there are sequentially arranged an ion converging means such as a charge filter 41 for converging, projecting and charge-classifying ions, and an end station having a disk 42 on which a wafer 30 is placed.

The disk 42 has a Faraday cup assembly 44 to measure the dose of the injected impurity and a measuring instrument 48 to measure the dose of the injected impurity based on the current of the beam. The Faraday cup 44 has a backward voltage applied thereto so as to prevent the generation of secondary electrons due to the ion-implantation.

In addition, the components from the outlet of the charge exchange and acceleration chamber 40 to the end station having disk 42 thereon can be set at an appropriate height in the second part B, and the inlet and body of the charge exchange and acceleration chamber 40 can be desirably arranged in the first part A, considering the radius of refractive curvature of the ion beam 46 from the ion mass analyzer 36.

As a result, the present invention effectively reduces the space required for the ion-implantation system by arranging only those components from the outlet of the charge exchange and acceleration chamber to the end station within the area containing the semiconductor fabrication line, while placing the inlet and body of the charge exchange and acceleration chamber in the lower part of the facility. The present invention provides a space-saving and cost-saving arrangement, thus improving competitiveness of the facility.

It will be apparent to those skilled in the art that various modifications and variations can be made in the ion-implantation system for fabricating a semiconductor device according to the present invention without departing from the spirit or scope of the invention. Thus, it is intended that the present invention cover the modifications and variations of this invention that come within the scope of the appended claims and their equivalents.

What is claimed is:

1. An ion-implantation system for a semiconductor device manufacturing line, comprising:

a first part located adjacent to a plane containing said manufacturing line; and a second part located in the plane containing said manufacturing line, said first part further comprising an ion source, an ion extractor an ion exchanger an ion mass analyzer, an ion accelerator, and a charge exchange and acceleration chamber along a path of an ion beam, wherein the ion mass analyzer is arranged so as to accommodate a vertical refraction method by which the ion beam is vertically refracted, and said second part further comprising a charge filter and an end station on which a wafer is mounted for ion-implantation along the path of the ion beam, wherein a plane corresponding to the first part but vertically separated from the first part by an amount of at least that of the second part may be utilized.

2. The ion-implantation system defined as in claim 1, wherein the first part is located below said area containing the manufacturing line.

3. The ion-implantation system defined as in claim 1, wherein the ion source is arranged in a manner that an impurity to be injected is supplied to a side of the ion source.

4. The ion-implantation system defined as in claim 1, wherein an outlet of the charge exchange and acceleration chamber is located in the second part of the ion-implantation system and an inlet and body of the charge exchange and acceleration chamber is located in the first part of the ion-implantation system.

5. The ion-implantation system as defined in claim 4, wherein the first part is located below the second part.

* * * * *